(12) United States Patent
Ohashi

(10) Patent No.: US 7,847,573 B2
(45) Date of Patent: Dec. 7, 2010

(54) TEST APPARATUS AND PERFORMANCE BOARD

(75) Inventor: Masatoshi Ohashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 261 days.

(21) Appl. No.: 11/946,870

(22) Filed: Nov. 29, 2007

(65) Prior Publication Data

US 2009/0261841 A1 Oct. 22, 2009

Related U.S. Application Data

(63) Continuation of application No. PCT/JP2007/054174, filed on Mar. 5, 2007.

(30) Foreign Application Priority Data

Mar. 17, 2006 (JP) .............................. 2006-074587

(51) Int. Cl.
G01R 31/26 (2006.01)
G01R 31/02 (2006.01)

(52) U.S. Cl. ....................... 324/765; 324/763; 324/573; 324/713; 714/738; 714/744; 702/118; 702/124

(58) Field of Classification Search ......... 324/537–765; 714/738–744; 702/118–124
See application file for complete search history.

(56) References Cited

U.S. PATENT DOCUMENTS 6,157,200 A * 12/2000 Okayasu ..................... 324/753

| 7,206,985 B2 * | 4/2007 | Ostendorf .................... 714/738 |
| 7,247,956 B2 * | 7/2007 | Berger et al. ................. 307/151 |
| 2006/0087328 A1 * | 4/2006 | Sasajima ..................... 324/713 |
| 2009/0058381 A1 * | 3/2009 | Kojima et al. ............... 323/275 |
| 2010/0049453 A1 * | 2/2010 | Watanabe et al. ............. 702/58 |

FOREIGN PATENT DOCUMENTS

| JP | 3-98315 | 4/1991 |
| JP | 7-218590 | 8/1995 |
| JP | 8-146094 | 6/1996 |
| JP | 10-73643 | 3/1998 |
| JP | 10-282191 | 10/1998 |
| JP | 2002-350508 | 12/2002 |
| JP | 2004-53412 | 2/2004 |

* cited by examiner

Primary Examiner—Ha Tran T Nguyen
Assistant Examiner—Emily Y Chan
(74) Attorney, Agent, or Firm—Jianq Chyun IP Office

(57) ABSTRACT

Provided is a test apparatus for testing a device under test, including: a plurality of signal supply sections that output test signals at different timing from each other; and a connection section that connects lines of wiring transmitting the test signals respectively outputted from the signal supply sections with each other, connects the lines of wiring to an input terminal of the device under test, and inputs the test signals to the input terminal after superposing the test signals. The connection section may include a performance board to which the device under test is mounted, where the lines of wiring are connected with each other on the performance board.

14 Claims, 7 Drawing Sheets

TEST APPARATUS AND PERFORMANCE BOARD

CROSS REFERENCE TO RELATED APPLICATION

This is a continuation application of PCT/JP2007/54174 filed on Mar. 5, 2007 which claims priority from a Japanese Patent Application No. 2006-074587 filed on Mar. 17, 2006, the contents of which are incorporated herein by reference.

BACKGROUND

1. Technical Field

The present invention relates to a test apparatus for testing a device under test, and to a performance board used for the test apparatus. In particular, the present invention relates to a test apparatus and a performance board for testing a device under test by using a signal of a high frequency.

2. Related Art

A method for inputting a predetermined test signal to a device under test is known as a method for testing a device under test such as a semiconductor circuit. For example, a test to a device under test is performed by determining whether an output signal outputted from the device under test in response to a test signal matches a predetermined expected value pattern or not. Additionally, in accordance with the recent trend of increasing the speed of semiconductor circuits, it is required to perform a test by using a test signal of a higher frequency.

FIG. 7 shows a configuration of a conventional test apparatus 300. The test apparatus 300 includes a pattern generating circuit 310, a waveform shaper 320, and a driver 330. The pattern generating circuit 310 generates a data pattern of a test signal to be inputted to a device under test 200. The waveform shaper 320 shapes a test signal based on the data pattern generated by the pattern generating circuit 310. The driver 330 inputs the test signal shaped by the waveform shaper 320 to the device under test 200.

In this case, the maximum frequency of a test signal that can be generated by the test apparatus 300 is defined by the maximum operating frequency of the pattern generating circuit 310, the waveform shaper 320, and the driver 330. For example, the maximum frequency of a test signal will be 250 MHz when the maximum operating frequency of the pattern generating circuit 310 is 250 MHz and the maximum operating frequencies of the waveform shaper 320 and the driver 330 are both 1 GHz.

In such a case, an embodiment is known to connect a plurality of pattern generating circuits 310 to a waveform shaper 320 as shown in FIG. 7, as one method for generating a faster test signal. In this case, the plurality of pattern generating circuits 310 generate a data pattern to be inputted to the waveform shaper 320 by an interleave technique. For example, when each of the two pattern generating circuits 310 is operated at the maximum operating frequency of 250 MHz as shown in FIG. 7, it is possible to generate a test signal of 500 MHz.

Note that Japanese Patent Application Publication No. 2002-350508 is listed herein as a prior art document.

When a much faster test signal is generated in the conventional test apparatus 300, it is necessary to connect a greater number of pattern generating circuits 310 to a waveform shaper 320. However, it is not possible to connect the number of waveform shapers 320 that is more than the number of pins for transmitting a signal between the pattern generating circuits 310 and the waveform shaper 320, or than the number of input pins of the waveform shapers 320. This restricts the maximum frequency of a test signal.

In addition, even when a multitude of pattern generating circuits 310 are connected to a waveform shaper 320, it is not possible to generate a test signal faster than the maximum operating frequency of the waveform shaper 320 and the driver 330. This also restricts the maximum frequency of a test signal.

SUMMARY

In view of this, it is an object of one aspect of the innovation included in the present specification to provide a test apparatus and a performance board that are capable of solving the foregoing problems. This object is achieved by combinations of features described in the independent claims. The dependent claims define further advantageous and concrete examples of the present invention.

According to an aspect related to the innovations herein, one exemplary test apparatus for testing a device under test includes: a plurality of signal supply sections that output test signals at different timing from each other; and a connection section that connects lines of individual wiring transmitting the test signals respectively outputted from the signal supply sections with each other, connects the connected lines of individual wiring to an input terminal of the device under test, and inputs the test signals to the input terminal after superposing the test signals.

According to an aspect related to the innovations herein, one exemplary test apparatus for testing a device under test includes: a plurality of signal acquiring sections that detect a comparison result of comparing a voltage value of an inputted signal with a standard voltage, at different timing from each other; and a connection section provided with lines of individual wiring inputting, by branching, an output signal of the device under test to each of the signal acquiring sections.

According to an aspect related to the innovations herein, one exemplary performance board used for a test apparatus, a device under test being mounted to the performance board, the performance board including: a plurality of terminals that receive test signals outputted from a plurality of signal supply sections of the test apparatus; lines of individual wiring that connect the plurality of terminals with each other on the performance board; and shared wiring that connects each of the lines of the individual wiring to an input terminal of the device under test, and inputs the test signals to the input terminal after superposing the test signals.

According to an aspect related to the innovations herein, one exemplary performance board used for a test apparatus, a device under test being mounted to the performance board, the performance board including: a plurality of terminals that supply an output signal of the device under test to a plurality of signal acquiring sections of the test apparatus; lines of individual wiring that connect the plurality of terminals with each other on the performance board; and shared wiring that connects each of the lines of individual wiring to an output terminal of the device under test, and input, by branching, the output signal of the device under test to the plurality of signal acquiring sections, via each of the lines of individual wiring.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
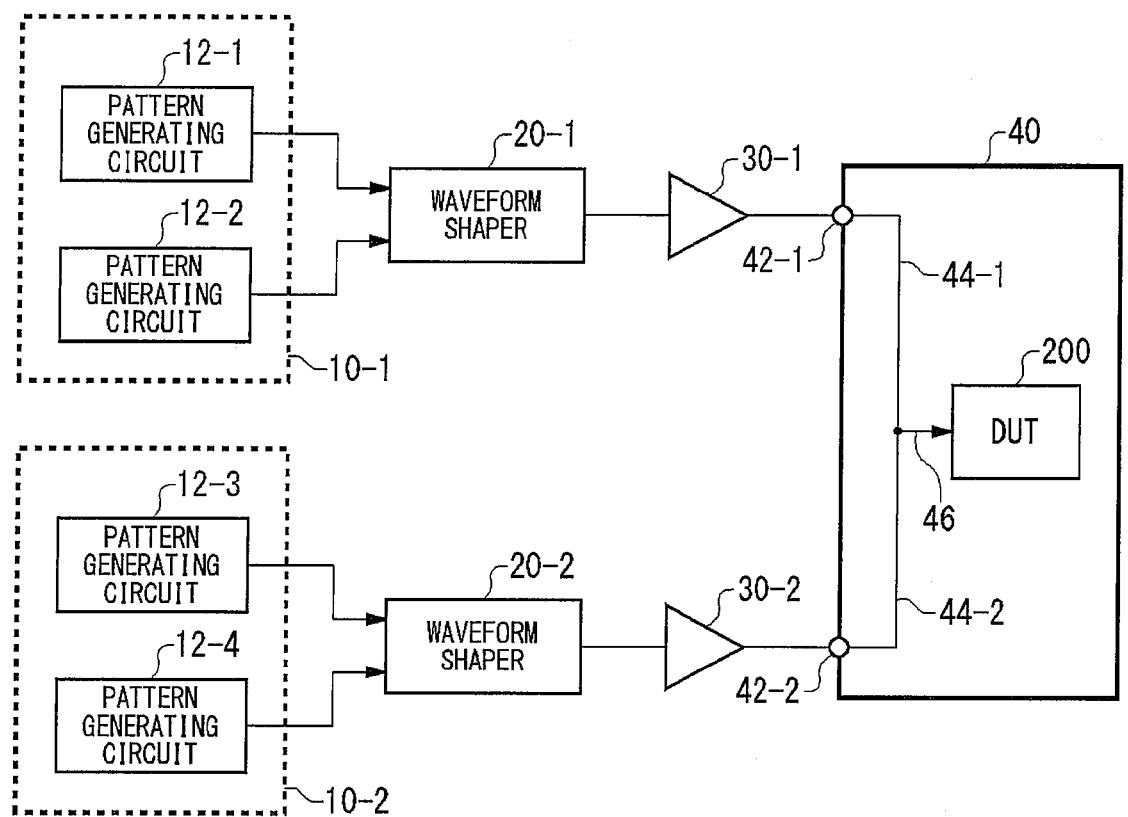
FIG. 1 shows one example of a configuration of a test apparatus 100 according to an embodiment of the present invention.

FIG. 1 shows one example of a configuration of a test apparatus 100 according to an embodiment of the present invention. The test apparatus 100 is an apparatus for testing a device under test 200 such as a semiconductor circuit, and includes a plurality of pattern generating sections (10-1, 10-2, hereinafter collectively referred to as "10"), a plurality of waveform shapers (20-1, 20-2, hereinafter collectively referred to as "20"), a plurality of drivers (30-1, 30-2, hereinafter collectively referred to as "30"), and a performance board 40. The driver 30 is one example of a signal supply section.

The device under test 200 is mounted to the performance board 40, and the performance board 40 electrically connects an input pin of the device under test 200 to the plurality of drivers 30. The performance board 40 includes a terminal 42, individual wiring 44, and shared wiring 46. The terminal 42 is provided in one-to-one relation with a plurality of lines of individual wiring 44. The terminal 42 may be a relay terminal, a relay connector, and so on, for connecting the output end of a driver 30 to be connected thereto, to a corresponding line of individual wiring 44.

One end of each line of individual wiring 44 is connected to a corresponding terminal 42. The other end of each line of individual wiring 44 is connected to each other on the performance board 40, and is electrically connected to the input/output terminal of the device under test 200.

The performance board 40 of the present example includes shared wiring 46 that connects a plurality of lines of individual wiring 44 to one input/output terminal of the device under test 200. More specifically, the individual wiring 44 connected to the plurality of drivers 30 is connected on the performance board 40, and is connected to the input terminal of the device under test 200 by means of the shared wiring 46. In addition, the line length of the shared wiring 46 should desirably be as short as possible. That is, each line of individual wiring 44 is connected to the shared wiring 46 in the immediate vicinity of the input/output terminal of the device under test 200.

For example, the line length of the shared wiring 46 can be at least shorter than the line length of the individual wiring 44 on the performance board 40. In addition, the line length of each individual wiring 44 on the performance board 40 is desirably substantially the same as each other.

In addition, the performance board 40 may be a socket board provided with one or more sockets for engaging with one or more devices under test 200. A socket connects the wiring on the performance board 40 to the input/output terminal of a device under test 200. For example, a socket may be provided with shared wiring 46 therein, which connects a plurality of lines of individual wiring 44 to one input/output terminal of a device under test 200. In addition, the plurality of drivers 30 may be provided in a pin electronics card that is separate from the performance board 40.

The pattern generating section 10 is provided for each waveform shaper 20, and supplies pattern data to a corresponding waveform shaper 20. Each pattern generating section 10 includes a plurality of pattern generating circuits (12-1, 12-2, hereinafter collectively referred to as "12").

Each pattern generating circuit 12 generates pattern data to be given to a corresponding waveform shaper 20, by an interleave technique. The interleave operation of the pattern generating circuit 12 is detailed later with reference to FIG. 2.

The waveform shaper 20 is provided for each driver 30, and generates a test signal to be supplied to a corresponding driver 30, based on the pattern data given by a corresponding pattern generating section 10. Each driver 30 outputs the received test signal at the timing different from each other. For example, each driver 30 alternately outputs test signals for a predetermined period.

A test signal outputted from each driver 30 is transmitted to a corresponding terminal 42 of the performance board 40, via wiring such as a coaxial cable for example. The individual wiring 44 and the shared wiring 46 may be pattern wiring formed on the surface of the performance board 40 for example. As described above, each line of individual wiring 44 is connected to a corresponding terminal 42 on the performance board 40. The shared wiring 46 connects the plurality of lines of individual wiring 44 connected to each other on the performance board 40, to the input/output terminal of the device under test 200. That is, the individual wiring 44 transmits a test signal inputted to a corresponding terminal 42, to an immediate vicinity of the device under test 200. Then the shared wiring 46 inputs each test signal transmitted by the individual wiring 44 after superposing the same, to the input terminal of the device under test 200. According to this, the performance board 40 functions as a connection section that inputs a test signal outputted by each driver 30 to the device under test 200, after superposing the same in the vicinity of the device under test 200.

In addition, the characteristic impedance of wiring connecting the driver 30 and the terminal 42 should desirably be substantially the same as the output impedance of the driver 30. Moreover, the characteristic impedance of the wiring, the individual wiring 44, and the shared wiring 46 should desirably be substantially the same. Here, "substantially the same" may mean that the characteristic impedance or the output impedance is approximated insomuch as that the amplitudes of the reflected waves generated in respective connection points lie in a permissible range for example.

Figure 2:
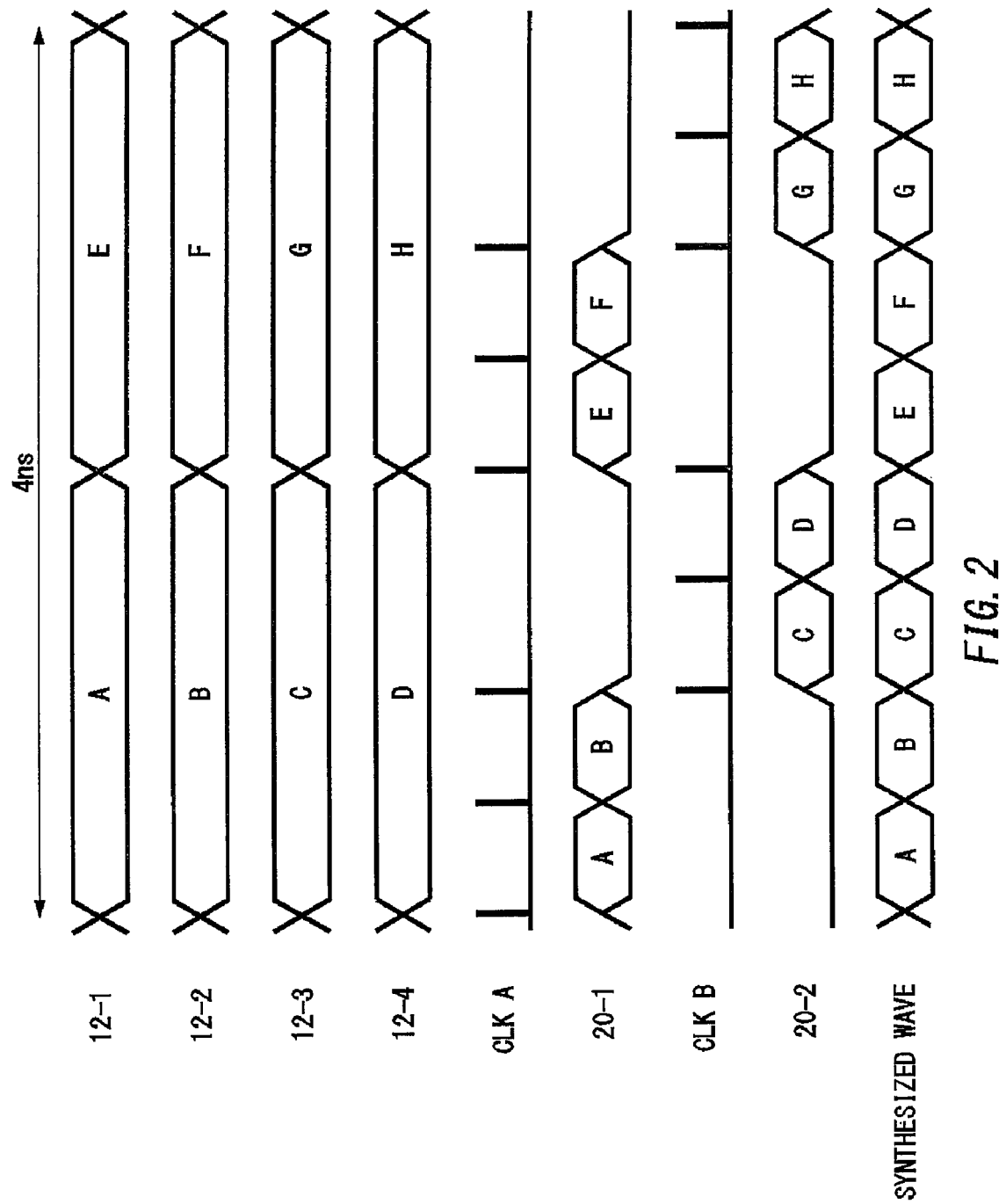
FIG. 2 is a timing chart showing one example of an operation of the test apparatus 100.

FIG. 2 is a timing chart showing one example of an operation of the test apparatus 100. The present example deals with a case where a test signal having data of 8 cycles during 4 ns (A, B, C, . . . H) is inputted to the device under test 200. Further in the present example, assumption is made so that the maximum operating period of each pattern generating circuit 12 is 2 ns (hereinafter referred to as "test period"). Also in the present example, two pattern generating circuits 12 are connected to each waveform shaper 20. That is, the test apparatus 100 in the present example generates a test signal having the number of patterns that is twice the maximum number of patterns that the waveform shaper 20 is capable of outputting within a predetermined period.

In the present example, the test apparatus 100 has four pattern generating circuits (12-1-12-4) just as shown in FIG. 1. The first pattern generating circuit 12-1 and the second pattern generating circuit 12-2 are connected to the first waveform shaper 20-1, and the third pattern generating circuit 12-3 and the fourth pattern generating circuit 12-4 are connected to the second waveform shaper 20-2. In other words, in the present example, two terminals 42 corresponding to two drivers 30 are connected on the performance board 40, as shown in FIG. 1.

A data pattern that is sequentially assigned each piece of data of a test signal (synthesized wave) to be inputted to a device under test 200 is set to each pattern generating circuit 12. For example, when the test apparatus 100 has n pattern generating circuits 12, a data pattern that is assigned mth data, m+nth data, m+2nth data, . . . of a test signal to be generated is set to an mth pattern generating circuit 12. In the present example, to the first pattern generating circuit 12-1, $1^{st}$ data (A) and $5^{th}$ data (E) of a test signal to be generated are assigned, and to the second pattern generating circuit 12-2, $2^{nd}$ data (B) and $6^{th}$ data (F) are assigned. To the third pattern generating circuit 12-3, $3^{rd}$ data (C) and $7^{th}$ data (G) are assigned, and to the fourth pattern generating circuit 12-4, $4^{th}$ data (D) and $8^{th}$ data (H) are assigned.

Each data pattern may be set, in advance, by a user with respect to each pattern generating circuit 12. Moreover the user may set, in advance, a data pattern of a test signal to be inputted to the device under test 200, with respect to the test apparatus 100. In this case, the test apparatus 100 may further include a pattern setting section that generates a data pattern to be set to each pattern generating circuit 12 based on the data pattern of the test signal having been set.

The pattern setting section may set a pattern to be generated by each pattern generating circuit 12, so that the pattern data to be given to each waveform shaper 20 is to be generated by a corresponding pattern generating circuit 12 by an interleave technique.

Each pattern generating circuit 12 may output a data pattern having been set, after synchronizing the same. Each pattern generating circuit 12 in the present example outputs data of each data pattern (A, B, C, D) in a predetermined test period, and outputs the subsequent data of each data pattern (E, F, G, H) in the subsequent test period.

Each waveform shaper 20 generates a test signal based on the data pattern outputted by a corresponding pattern generating circuit 12, by being synchronized to each test period. The waveform shaper 20 in the present example generates a test signal in the test period, according to a clock signal given for each test period. In addition, each waveform shaper 20 and each driver 30 should desirably output a signal of substantially the same period as the period of the test signal to be inputted to the device under test 200.

A clock signal is given to the first waveform shaper 20-1 in the first half of each test period. Since the first waveform shaper 20-1 outputs a test signal indicating two sets of data (A, B) (C, D) in the first half of each test period, the clock signal should desirably include three edges in the first half of each test period, for example as shown in FIG. 2. The clock signal in the present example includes these edges at respective timing of the head, the center, and the tail, in the first half of a test period. Likewise, a clock signal supplied to the second waveform shaper 20-2 should desirably include three edges in a substantially constant interval in the last half of each test period. The clock signal in the present example includes these edges at respective timing of the head, the center, and the tail, in the last half of a test period. The test apparatus 100 may further include a timing control section that supplies the clock signal to each waveform shaper 20.

A test signal outputted from each waveform shaper 20 is synthesized on the performance board 40 via the driver 30. According to this, the waveform shaper 20 is able to supply a test signal having the number of patterns that is twice the number of patterns (2 in the present example) that the waveform shaper 20 is capable of outputting within each test period, to the device under test 200.

Figure 3:
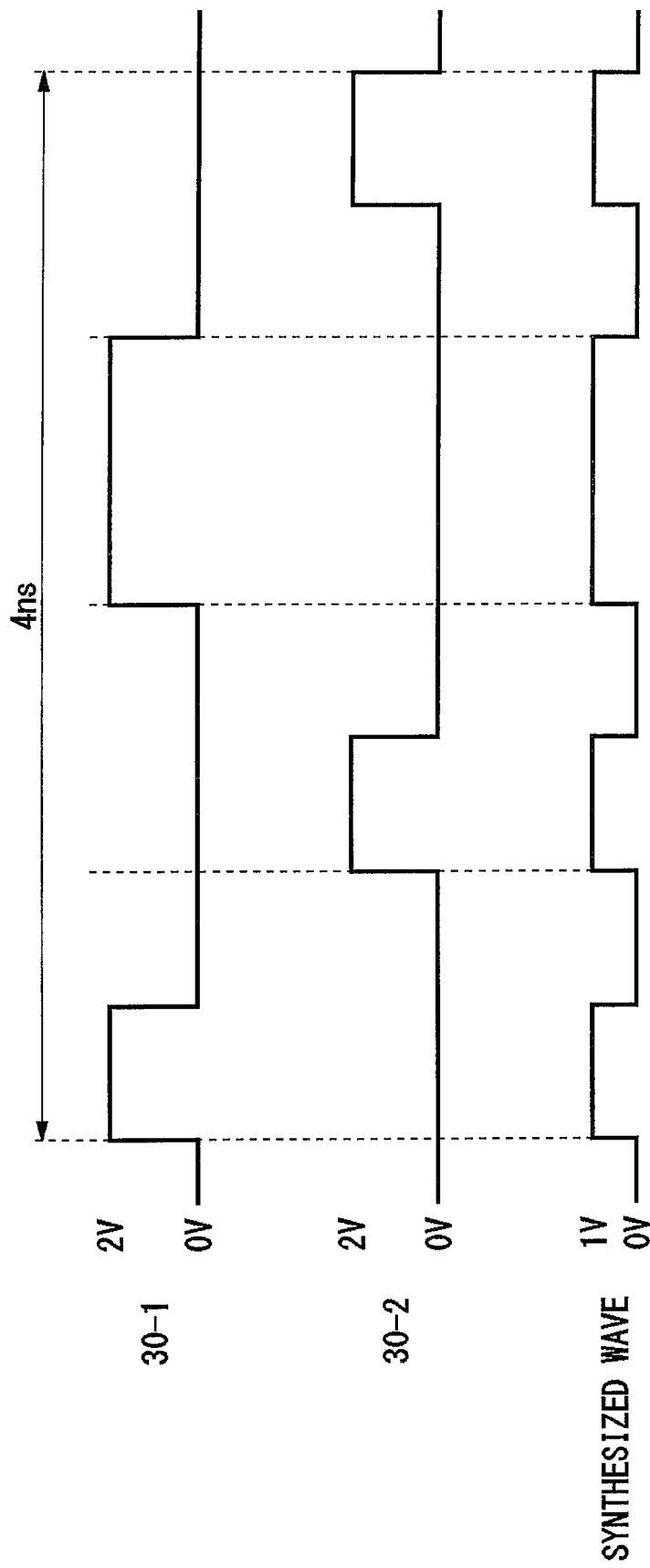
FIG. 3 shows one example of the waveform of each test signal outputted from each driver 30.

FIG. 3 shows one example of the waveform of each test signal outputted from each driver 30. In the present example, the first driver 30-1 outputs a test signal for a period of 0-1 ns (data pattern 1, 0), and for a period of 2-3 ns (data pattern 1, 1), while the second driver 30-2 outputs a test signal for a period of 1-2 ns (data pattern 1, 0), and for a period of 3-4 ns (data pattern 0, 1). Here, the delay time for the transmission line from the output end of each driver 30 to the input/output terminal of the device under test 200 should desirably be substantially the same as each other.

Each driver 30 may output a signal fixed to a predetermined voltage value, for a period in which another driver 30 is outputting a test signal. In other words, each driver 30 functions as a circuit terminating the wiring by a predetermined voltage value, while another driver 30 is outputting a test signal. For example, the first driver 30-1 may output a signal fixed to the voltage value of L level (e.g. 0V), for a period (1-2 ns, 3-4 ns) in which the second driver 30-2 is outputting a test signal. In addition, the second driver 30-2 may output a signal fixed to the voltage value of L level, for a period (0-1 ns, 2-3 ns) in which the first driver 30-1 is outputting a test signal.

According to the above arrangement, the test signal outputted by the first driver 30-1 is terminated by the output impedance of the second driver 30-2. Likewise, the test signal outputted by the second driver 30-2 is terminated by the output impedance of the first driver 30-1. Each driver 30 should desirably adjust the timing of outputting a signal of H level, so that a signal of H level (e.g. 2V) outputted by each driver 30 does not undergo superpose addition by being synthesized at the input terminal of the device under test 200. The timing adjustment may be performed by a pattern program generating the aforementioned data pattern for example. For example, the timing of inputting the data pattern to each driver 30 may be adjusted by a pattern program. Each pattern generating section 10 may generate pattern data of a test signal to be outputted by a corresponding waveform shaper 20 based on the pattern program, and store the result in the order in which they are outputted to corresponding drivers 30.

According to such control, it is possible to synthesize test signals outputted by the driver 30 without affecting the data pattern of each test signal. In addition, when the fixed voltage value of each driver 30 is 0V, the voltage value to be outputted by the driver 30 when the test signal indicates logic H should desirably be substantially twice the voltage value in the case where the test signal inputted to the device under test 200 indicates logic H. That is, when the amplitude of a test signal inputted to the device under test 200 is 1V, the amplitude of the test signal outputted by the driver 30 should desirably be 2V.

When the wiring from the output end of the driver 30 to the terminal 42, the individual wiring 44, the shared wiring 46, the output end of each driver 30, and the input end of the device under test 200 connected on the performance board 40 match in terms of impedance, the amplitude of a test signal inputted to the device under test 200 will be substantially half the amplitude of the test signal outputted by the driver 30. For example, when the driving voltage of the driver 30 is 2V as shown in FIG. 3, the amplitude of the test signal inputted to the device under test 200 will be 1V. For this reason, by performing control so that the driving voltage of the driver 30 is approximately twice the test signal to be inputted to the device under test 200 as mentioned above, it is possible to input a test signal of a desired amplitude with respect to the device under test 200.

Moreover, each driver 30 may output a voltage other than 0V as a fixed voltage value (reference voltage value). The reference potential of a test signal inputted to the device under test 200 is determined based on this voltage. For example, when an overvoltage stress is attempted to be applied to the device under test 200, each driver 30 may output a voltage value that is in accordance with the overvoltage stress as the fixed voltage value. The overvoltage stress may mean to input a test signal having a large voltage compared to the range of voltage values that is determined by the specification of the device under test 200 or the like, and that a test signal is to own, for example.

Figure 4:
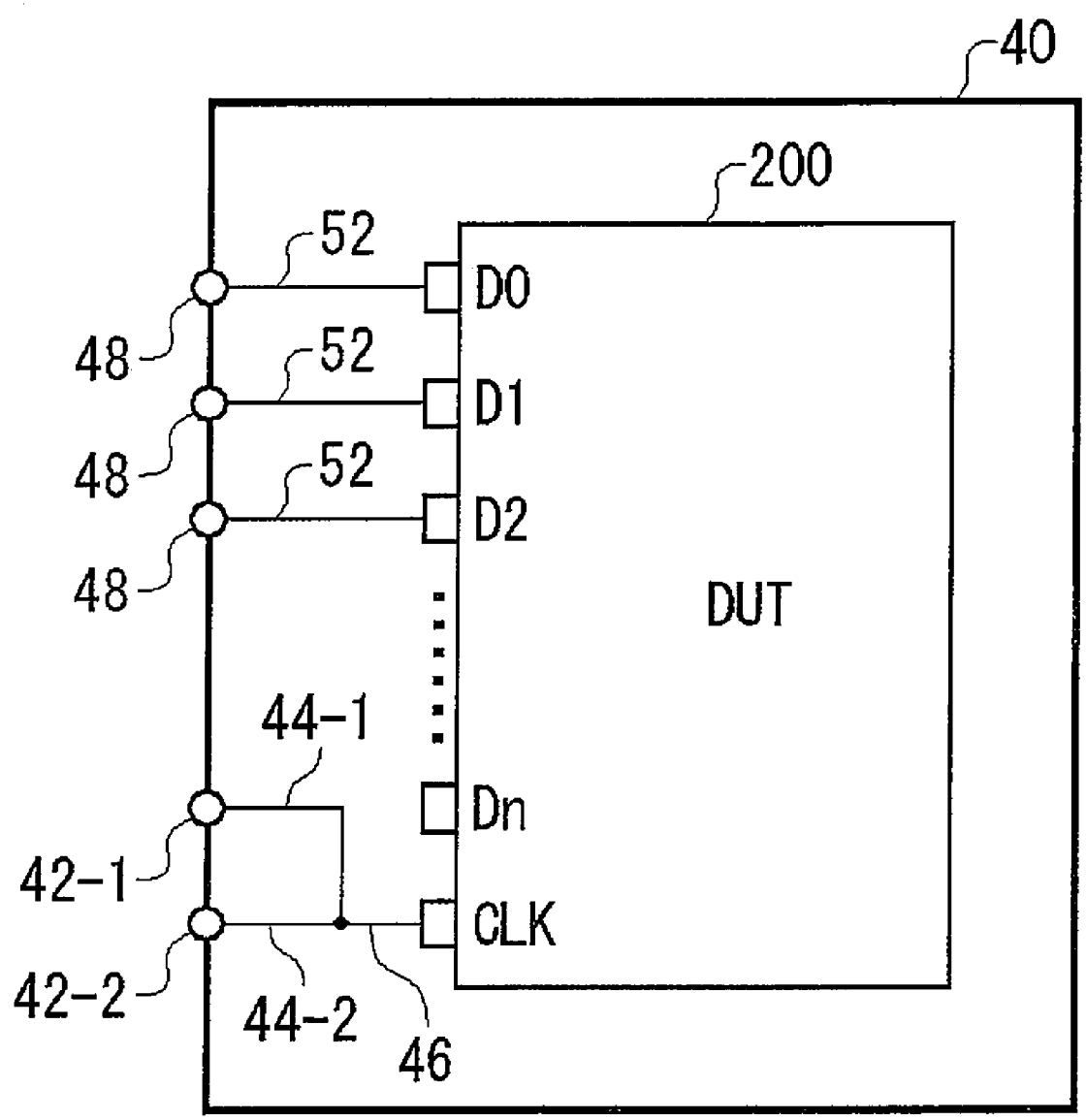
FIG. 4 shows one example of wiring on a performance board 40.

FIG. 4 shows one example of wiring on a performance board 40. The performance board 40 includes individual wiring 44, shared wiring 46, and wiring 52 for electrically connecting respective input/output terminals of devices under test 200 (D0, D1, D2, . . . Dn, CLK) to respective drivers 30 of the test apparatus 100. As mentioned above, by connecting the output ends of two drivers 30 for example to one input/output terminal of the device under test 200, it is possible to input a test signal having twofold pieces of data for example to the input/output terminal.

For example as explained with reference to FIG. 1 through FIG. 3, by connecting the output of two drivers 30 on the performance board 40 and connecting the same to one input/output terminal of the device under test 200, it is possible to input a test signal of twofold frequency to the input/output terminal. Here, "twofold frequency" may mean twice the frequency of the upper limit of the signal outputted by one driver 30. In addition, the "twofold frequency" may mean that the data pattern inputted to the device under test 200 has the number of pieces of data that is twice the pieces of data in conventional cases.

In the present example, the performance board 40 includes individual wiring 44 and shared wiring 46 for connecting two drivers 30 with respect to the clock input pin (CLK) of the device under test 200. According to this, it becomes possible to input a clock of a high frequency with respect to the device under test 200. In addition, the performance board 40 may include wiring 52 for connecting each data input pin (D0, D1, . . . Dn) of the device under test 200 to a corresponding terminal 48. The terminal 48 is connected to a driver 30. Since the pulse of a clock has a certain period, it is possible to easily generate a clock of a twofold speed, by generating the pattern program by performing an interleave technique to the output of the two drivers 30 as explained above with reference to FIG. 1 through FIG. 3.

Figure 5:
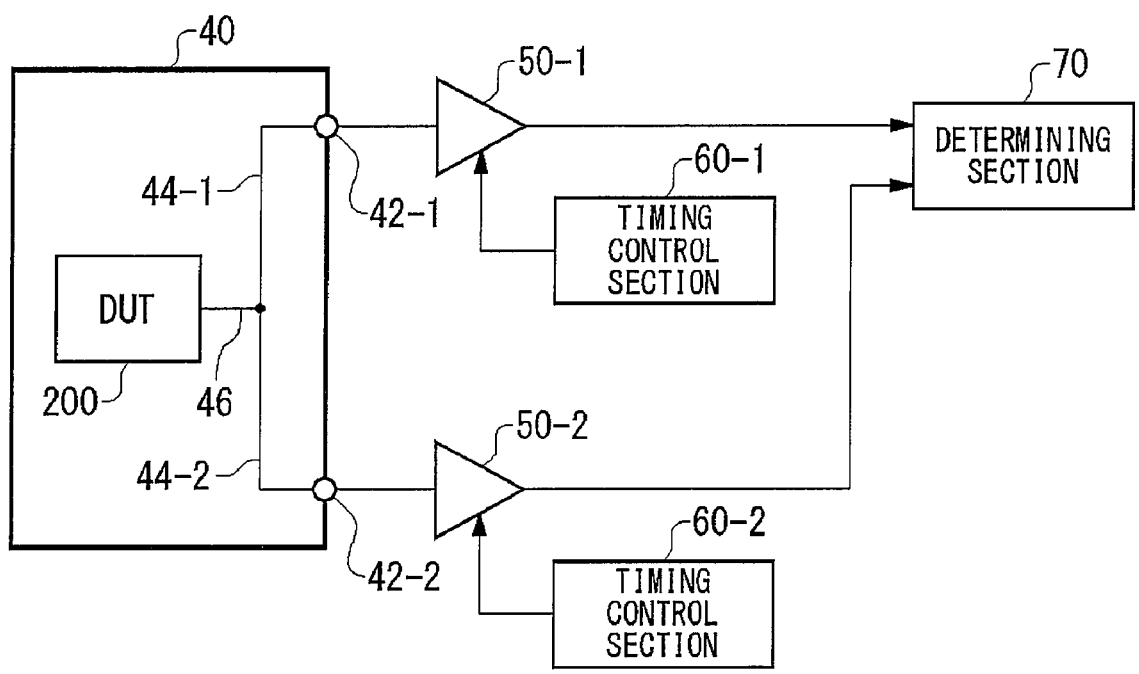
FIG. 5 shows a different configuration example of the test apparatus 100.

FIG. 5 shows a different configuration example of the test apparatus 100. FIG. 1 deals with a configuration of inputting a test signal to a device under test 200, whereas FIG. 5 deals with a configuration of measuring an output signal of a device under test 200. The test apparatus 100 may be an apparatus resulting from combining the configurations in FIG. 1 through FIG. 5.

The test apparatus 100 in the present example includes a performance board 40, a plurality of comparators (50-1, 50-2, hereinafter collectively referred to as "50"), a plurality of timing control sections (60-1, 60-2, hereinafter collectively referred to as "60"), and a determining section 70. The comparator 50 is one example of a signal acquiring section. A device under test 200 is mounted to the performance board 40, and the performance board 40 electrically connects the output pins of the device under test 200 to the plurality of comparators 50. The plurality of comparators 50 are for example provided for a pin electronics card that is separate from the performance board 40.

Each comparator 50 outputs a logic signal indicating a comparison result of comparing a voltage value of an inputted signal (hereinafter referred to as "response signal") with a predetermined standard voltage (e.g. "high level voltage value" or "low level voltage value" used in determining the logic state of the response signal of the device under test 200). In addition, the comparator 50 may compare the input signal timing according to a strobe signal given by the timing control section 60. Here, the timing comparison may be a process of generating a timing determining signal resulting by sequentially acquiring the logic value of the logic signal indicating the aforementioned comparison result at the strobe signal timing, or may be a process of further including a process of comparing the acquired timing determining signal with a predetermined expected value pattern. Each comparator 50 acquires a logic value of the aforementioned logic signal at different timing from each other, and generates each timing determining signal.

The comparator 50 may include a level comparator for comparing an analogue response signal outputted from the device under test 200 with a predetermined standard voltage and converting the same into a logic signal. In addition, the comparator 50 may further include a timing comparator for outputting a timing determining signal having been subjected to the timing determination (i.e. a timing determining signal whose logic value of the logical signal has been acquired), at the timing of the given strobe signal.

In addition, the comparator 50 includes, in parallel, a level comparator in which the high level voltage value is given as the standard voltage and a level comparator in which the low level voltage value is given as the standard voltage, to simultaneously perform measurement using the high level voltage value and the low level voltage value. In this case, the comparator 50 may include two timing comparators in correspondence with the two level comparators.

In the present example, an output signal from the device under test 200 is inputted to each comparator 50, by branching. For example, the shared wiring 46 connected to the input/output terminal of the device under test 200 and the input terminal of each comparator 50 are connected by means of the individual wiring 44 on the performance board 40. That is, the terminal 42 of the performance board 40 connected to the input terminal of the comparator 50 is connected to one line of shared wiring 46 via the individual wiring 44, and is connected to the input/output terminal of the device under test 200. According to this, the wiring connecting the device under test 200 and the comparator 50 is branched on the performance board 40, to be connected to a plurality of terminals 42. Then, each terminal 42 supplies an output signal of the device under test 200 to a corresponding comparator 50. The test apparatus 100 may have a device under test 200 capable of driving individual wiring 44 divided into two branches, as a test target.

In addition, the strobe signal inputted to the first comparator 50-1 may be provided with an edge in the first half of a predetermined period, just as in the case of the clock signal explained with reference to FIG. 2. The strobe signal inputted to the second comparator 50-2 may be provided with an edge in the last half of a predetermined period, just as in the case of the clock signal explained with reference to FIG. 2. The timing control section 60 may generate a strobe signal having such an edge. Each comparator 50 may output the aforementioned timing determining signal on the timing of the edge of the strobe signal.

Figure 6:
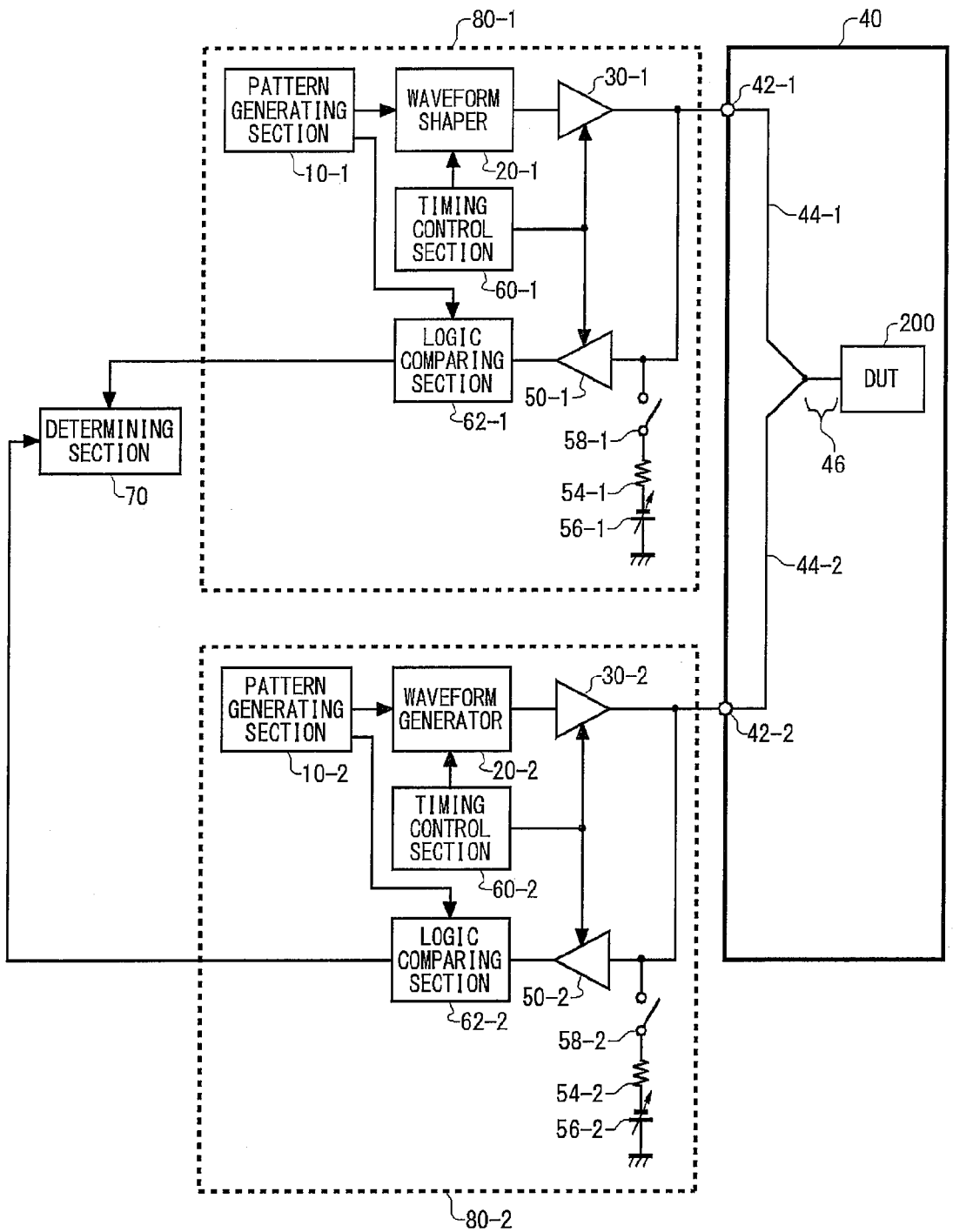
FIG. 6 shows a still different configuration example of the test apparatus 100.
Figure 7:
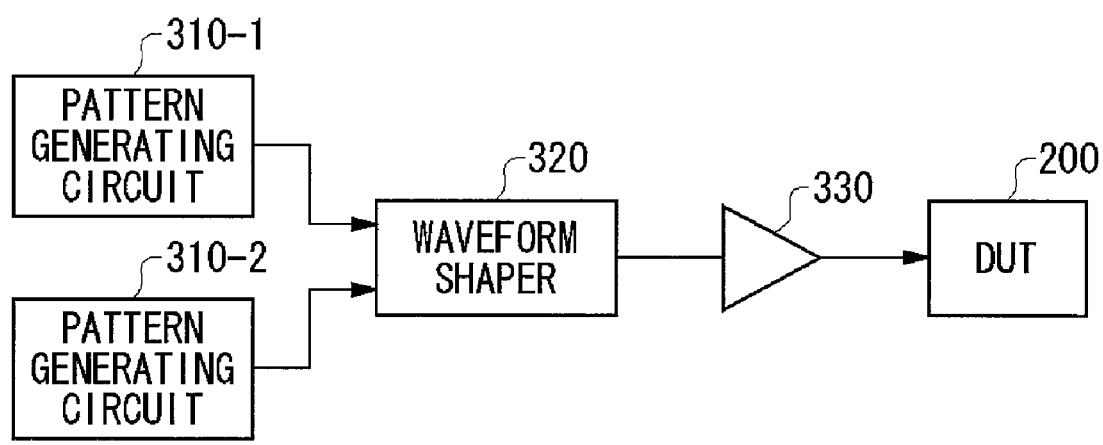
FIG. 7 shows a configuration of a conventional test apparatus 300.

In addition, a terminating resistance 54 as shown in FIG. 6 may be provided in the vicinity of the input terminal of each comparator 50. The terminating resistance 54 is provided between the input terminal of the comparator 50 and the reference potential. The resistance value of the terminating resistance 54, the input impedance of the comparator 50, the characteristic impedance of the wiring from the terminal 42 to the comparator 50, the characteristic impedance of the individual wiring 44, and the characteristic impedance of the shared wiring 46 may be substantially the same. The wiring from the terminal 42 to the comparator 50 may be a coaxial cable or the like. In addition, the line length of the shared wiring 46 should desirably be as short as possible.

In addition, the terminating resistance 54 may be provided between the input terminal of the comparator 50 and the terminating power supply 56. The terminating power supply 56 is a variable direct current voltage supply, and is provided between the terminating resistance 54 and the ground potential. The terminating power supply 56 defines a terminating voltage of a signal inputted to the comparator 50 to a predetermined voltage.

The first timing control section 60-1 generates a strobe signal to be inputted to the first comparator 50-1, whereas the second timing control section 60-2 generates a strobe signal to be inputted to the second comparator 50-2. In the present example, each comparator 50 is provided with a timing control section 60, however it is alternatively possible to arrange so that one timing control section 60 generates each strobe signal in another example. In addition, the timing control section 60 may further generate a clock signal explained with reference to FIG. 2.

The determining section 70 determines whether the device under test 200 passes or fails the test, based on the comparison result outputted from each comparator 50. For example the determining section 70 may determine whether the device under test 200 passes or fails the test, by comparing the comparison result with a given expected value pattern.

According to the test apparatus 100 in the present example, it is possible to measure a signal under test of a higher frequency than the maximum operating frequency of one comparator 50. For example, in the case where a signal under test is inputted by branching to two comparators 50, it is possible to measure a signal under test at a speed twice the upper limit of the operating speed of one comparator 50. For this reason, it is possible to perform a test of a device under test 200 operating at a high speed. Since the quality of a signal inputted to each comparator 50 deteriorates according to the number of branching that a signal under test has undergone, the number of comparators 50 to which a signal under test is inputted by branching may be determined according to a waveform quality that the signal inputted to one comparator 50 should have. For example, the performance board 40 may include a switch section for switching whether to connect each line of individual wiring 44 to the shared wiring 46 or not, on the performance board 40. Likewise, the performance board 40 may include a switch section also for connecting the output of the driver 30, just as explained with reference to FIG. 1 through FIG. 3.

FIG. 6 shows a still different configuration example of the test apparatus 100. The test apparatus 100 in the present example includes a plurality of input/output circuits 80, a performance board 40, and a determining section 70. The performance board 40 and the determining section 70 may be the same as the performance board 40 and the determining section 70 explained with reference to FIG. 1 through FIG. 5. In addition, the present example deals with a case in which two input/output circuits 80 are included.

Each input/output circuit 80 includes a pattern generating section 10, a waveform shaper 20, a driver 30, a comparator 50, a timing control section 60, a logic comparing section 62, a switch 58, a terminating resistance 54, and a terminating power supply 56. The pattern generating section 10, the waveform shaper 20, the driver 30, the comparator 50, the timing control section 60, the terminating resistance 54, and the terminating power supply 56 may be the same as the corresponding elements described using the same reference numerals from FIG. 1 to FIG. 5, respectively.

The switch 58 is provided between the input end of the comparator 50 and the terminating resistance 54. The switch 58 switches whether to terminate the input end of the comparator 50 at the resistance value of the terminating resistance 54, by switching whether to connect the terminating resistance 54 to the input end of the comparator 50. Note that when the terminating resistance 54 is not connected to the input end of the comparator 50, the input end of the comparator 50 may be terminated by the output impedance of the driver 30.

When the switch 58 is brought to the ON state, the driver 30 may be controlled to the inactive state. In such a case, the input end of the comparator 50 is terminated by the terminating resistance 54. Note that the inactive state may be a state where the output of the driver 30 is rendered as a high impedance.

When the switch 58 is brought to the OFF state, the driver 30 may be controlled to the active state. In such a case, the input end of the comparator 50 is terminated by the output impedance of the driver 30. Note that the active state may be a state where the output impedance of the driver 30 becomes the same level as that of the transmission line, and the driver 30 is in the state capable of outputting a signal.

In addition, each switch 58 of the two input/output circuits 80 should desirably operate in synchronization. For example, each switch 58 may be controlled either to the ON state or the OFF state, according to whether to input a test signal to the device under test 200 or to measure an output signal from the device under test 200.

In addition, the logic comparing section 62 may compare a logic pattern of a signal under test subjected to the timing determination according to the strobe signal generated by the timing control section 60 with the expected value pattern generated by the pattern generating section 10. The determining section 70 determines whether the device under test 200 passes or fails the test, based on the comparison result in each logic comparing section 62. For example, the determining section 70 may determine that the device under test 200 passes the test, if the logic pattern of the signal under test matches the expected value pattern with respect to all the logic comparing sections 62.

In addition, the timing control section 60 may supply a timing signal used for waveform shaping, to the waveform shaper 20. In addition, the timing control section 60 may supply a strobe signal used in the timing determination, to the comparator 50. In addition, the timing control section 60 may supply a driver enable signal for controlling the driver 30 to the active state or to the inactive state, to the driver 30, or may supply the same to the driver 30 via the waveform shaper 20.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

According to an aspect of the present invention, it becomes possible to realize a test apparatus and a performance board capable of inputting, to a device under test, a test signal of a higher frequency than the maximum operating frequency of each pin of a test apparatus. According to this, it becomes possible to test a faster device under test. For example, by designing the connection configuration of the driver 30 in FIG. 1 and the connection configuration of the comparator 50 in FIG. 5 to be applicable to all the pins of the device under test 200 so as to create a pattern program for creating a corresponding test pattern and storing the pattern program into the pattern generating section 10, it becomes possible to test each device under test 200 with the frequency that is twice the test limit frequency of the test apparatus, although the number of the measurements and tests is reduced by half According to this, the embodiment examples of the present invention achieve an effect of enabling to test a faster device under test 200 having been unable to be tested conventionally.

In addition, FIG. 1 has shown a configuration in which each pattern generating section 10 includes two pattern generating circuits 12. However the pattern generating section 10 may be configured to have one pattern generating circuit 12. In any configuration, by applying the connection configuration of the driver 30 in FIG. 1 and/or the connection configuration of the comparator 50 in FIG. 5 to the input/output terminal being the test target of the device under test 200, it is possible to test a device under test 200 with the frequency that is twice the test limit frequency of the test apparatus 100.

What is claimed is:

1. A test apparatus for testing a device under test, comprising:
    a plurality of signal supply sections that output test signals at different timing from each other;
    a connection section that connects lines of individual wiring transmitting the test signals respectively outputted from the signal supply sections with each other, connects the connected lines of individual wiring to an input terminal of the device under test, and inputs the test signals to the input terminal after superposing the test signals;
    a plurality of waveform shapers provided for the signal supply sections respectively, each of the waveform shapers generating a test signal to be supplied to a corresponding one of the signal supply sections, based on given pattern data; and
    a plurality of pattern generating sections provided for the waveform shapers respectively, each of the pattern generating sections supplying the pattern data to a corresponding one of the waveform shapers, wherein
    each of the pattern generating sections includes a plurality of pattern generating circuits that generate the pattern data to be given to a corresponding one of the waveform shapers by an interleave technique.

2. The test apparatus as set forth in claim 1, wherein
    the connection section includes a performance board to which the device under test is mounted, and
    the lines of individual wiring are connected with each other on the performance board, and are connected to the input terminal of the device under test.

3. The test apparatus as set forth in claim 2, wherein
    the connection section further includes shared wiring that is provided on the performance board and whose one end is connected to the input terminal of the device under test, and
    each of the lines of individual wiring is connected to the other end of the shared wiring.

4. The test apparatus as set forth in claim 3, wherein
    a line length of the shared wiring is shorter than a line length of each of the lines of individual wiring on the performance board.

5. The test apparatus as set forth in claim 4, wherein
    the line length of each of the lines of individual wiring on the performance board is substantially the same as each other.

6. The test apparatus as set forth in claim 3, wherein
    the shared wiring is connected to a clock input terminal of the device under test.

7. The test apparatus as set forth in claim 1, wherein
    each of the signal supply sections outputs a signal fixed to a predetermined voltage value, which determines a reference potential of the test signal inputted to the device under test, to the connection section while another of the signal supply sections is outputting a test signal.

8. The test apparatus as set forth in claim 7, wherein
    an output impedance of each of the signal supply sections is substantially the same as a characteristic impedance of the individual wiring.

9. The test apparatus as set forth in claim 1, wherein
    the waveform shapers are a first waveform shaper and a second waveform shaper, which operate in synchronization with a predetermined test period, where the first waveform shaper outputs a test signal in the first half of each test period, and the second waveform shaper outputs a test signal in the last half of each test period.

10. The test apparatus as set forth in claim 9, wherein
    each of the pattern generating sections stores pattern data of a test signal to be outputted by a corresponding one of the waveform shapers, in the order in which the pattern data is to be outputted.

11. The test apparatus as set forth in claim 9, wherein
    the first waveform shaper and the second waveform shaper output a test signal in accordance with a given clock signal, and the test apparatus further comprises: a timing control section that supplies the clock signal to the first waveform shaper in the first half of the test period, and supplies the clock signal to the second waveform shaper in the last half of the test period.

12. The test apparatus as set forth in claim 1, further comprising:
    a pattern setting section that sets a pattern to be generated by each of the pattern generating circuits, so that the pattern data to be given to each of the waveform shapers is generated by a corresponding one of the pattern generating circuits by an interleave technique.

13. The test apparatus as set forth in claim 1, wherein
    the signal supply sections are a first signal supply section and a second signal supply section, and
    the first signal supply section and the second signal supply section generate a test signal having an amplitude that is substantially twice an amplitude of a signal to be inputted to the device under test.

14. The test apparatus as set forth in claim 1, wherein the signal supply section includes a driver.

* * * * *